United States Patent [19]

Suwa

[11] 3,962,641
[45] June 8, 1976

[54] TUNING APPARATUS

[75] Inventor: Hisashi Suwa, Sagamihara, Japan

[73] Assignee: Sony Corporation, Tokyo, Japan

[22] Filed: Dec. 20, 1974

[21] Appl. No.: 534,796

[30] Foreign Application Priority Data
Dec. 27, 1973 Japan.................................. 48-4684

[52] U.S. Cl.................................. 325/455; 334/86
[51] Int. Cl.². .......................................... H04B 1/06
[58] Field of Search.... 325/455, 452, 453, 457–459, 325/464, 468; 334/86, 87; 331/16, 17

[56] References Cited
UNITED STATES PATENTS

| | | | |
|---|---|---|---|
| 2,632,058 | 3/1953 | Gray | 340/347 DD |
| 3,491,714 | 1/1970 | King | 325/455 X |
| 3,704,423 | 11/1972 | Kadron et al. | 325/458 |

*Primary Examiner*—Benedict V. Safourek
*Assistant Examiner*—Robert Hearn
*Attorney, Agent, or Firm*—Lewis H. Eslinger; Alvin Sinderbrand

[57] ABSTRACT

In a tuning apparatus for a broadcast receiver having a voltage controlled variable frequency oscillator for generating a local frequency signal corresponding to a selected broadcasting station, and being provided with a phase locked loop including a reference signal oscillator, a variable frequency divider which receives the local frequency signal, usually through a prescaler, for further dividing the local frequency signal with a variable dividing ratio, and a frequency and phase comparator for comparing outputs of the reference signal oscillator and the variable frequency divider, respectively, and producing a corresponding control voltage which is applied through a low pass filter to the voltage controlled oscillator for determining the local frequency signal in dependence on the dividing ratio of the variable frequency divider; a dial member is provided with a scale calibrated to represent broadcast frequencies over a predetermined frequency band and cooperating with an indicator movable along the scale for indicating the broadcast frequency to which the tuning apparatus is tuned, a series of digitally coded indicia, for example, in the form of holes in the dial member, are provided to respectively correspond to a plurality of broadcasting stations which are adapted to be selectively received by the broadcast receiver, such digitally coded indicia being spaced apart in correspondence with the spacing of the broadcast frequencies of the respective stations along the scale, and an optical or other pickup is movable relative to the series of digitally coded indicia in the direction along such series and in synchronism with the movement of the indicator along the scale for selectively reading the digitally coded indicia and correspondingly determining the dividing ratio of the variable frequency divider in accordance with the digitally coded indicia selectively read by the pickup.

9 Claims, 2 Drawing Figures

TUNING APPARATUS

BACKGROUND OF THE INVENTION

1. Field of the Invention

This invention relates generally to a tuning apparatus, for example, of a broadcast receiver, and more particularly is directed to an improved tuning apparatus of the type including a frequency synthesizer with a phase locked loop.

2. Description of the Prior Art

Existing FM tuners usually employ a variable condenser actuated by manipulation of a tuning knob for varying the local frequency of a local oscillator so as to select the radio wave broadcast by a desired station for reception by the broadcast receiver. Manipulation of the tuning knob also causes relative movement of an indicator and dial provided with a scale calibrated to represent broadcast frequencies over a predetermined frequency band. If the user knows the assigned frequency of the desired station or channel, the tuning knob is manipulated until the indicator is disposed at such assigned frequency on the cooperating scale and the variable condenser then more or less achieves the local frequency for receiving the radio wave broadcast by the selected or desired station. If the user does not know the assigned frequency of the desired station or channel, then the tuning knob is simply manipulated to cause the indicator to scan the scale and to similarly actuate the variable condenser until the desired station is being received. In either case, accurate tuning is not always possible by reason of the fact that the variable condenser is being manually actuated or controlled, and the foregoing problem is not fully avoided by providing the receiver with a tuning meter.

In order to provide more accurate tuning of broadcast receivers, an AM and FM receiver has been proposed that uses a frequency synthesizer with a phase locked loop, for example, as described in Fairchild Semiconductor's application by J. Stinehelfer and J. Nichols, 1969, entitled "A digital Frequency Synthesizer for an AM and FM Receiver". Such frequency synthesizer for tuning an FM and AM radio essentially consists of a voltage-controlled oscillator, a programmable divider, a frequency and phase comparator, and a reference frequency generator. The voltage-controlled oscillator is the local oscillator of the tuner, and the output signal of the voltage-controlled oscillator is divided by the programmable divider, whereupon the frequency and phase of the signal thus divided is compared, in the comparator, with the crystal-controlled reference frequency or signal. The resulting voltage output or control signal from the comparator controls the voltage-controlled oscillator so that the local frequency of the latter will be a selected multiple of the reference frequency, as determined by the dividing ratio of the programmable or variable frequency divider.

In the above frequency synthesizer, the programmable or variable frequency divider may be constituted by a down counter which is operated by clock pulses corresponding to the local frequency signal, usually after passage of the latter from the voltage-controlled oscillator through a prescaler or fixed divider. The down counter is loaded or preset with the value of a selected dividing ratio each time the counter has counted down to a predetermined value, for example, to "0", at which time a pulse is also applied from the variable frequency divider to the comparator. After such loading or presetting of the counter, each clock pulse merely causes the counter to count down by one until it has again counted down to the predetermined value to emit a pulse and to be again preset with the value of the selected dividing ratio. It will be apparent that, with the described frequency sunthesizer, a different dividing ratio has to be provided for each of the broadcasting stations to be received.

The FM broadcast band in the United States consists of one hundred channels, each 200 KHz wide, starting at 88.0 MHz. The carrier for the first channel is at 88.1 MHz, and the carrier for the last channel is at 107.9 MHz. By reason of the standard 10.7 MHz intermediate frequency that is employed, the local frequencies to be produced by the voltage controlled oscillator have to be 10.7 MHz higher than the frequencies of the carriers. Thus, the local oscillator frequencies that are required range from 98.8 MHz to 118.6 MHz, with 200 KHz spacing between adjacent local oscillator frequencies. In any case, it will be apparent that in an FM broadcast receiver having a digital frequency synthesizer for use in the United States, provision has to be made for selectively loading or presetting one hundred different or discrete values of the dividing ratio in the variable frequency divider, which values respectively correspond to the one hundred channels of the FM broadcast band. In existing broadcast receivers, as aforesaid, station selection has been achieved by providing the tuning apparatus with a panel having an array of push-buttons respectively corresponding to the various stations or channels of the FM broadcast band, with each push-button being effective, when manually depressed, to cause an associated control circuit to apply a respective control signal to the variable frequency divider for establishing the desired dividing ratio in the latter. However, with such a station selecting arrangement, if the user does not know the assigned frequency of a desired station or channel, the successive actuation of the push-buttons for locating such station is a bothersome and time consuming operation, particularly as many of the push-buttons will correspond to stations of the broadcast band that are not receivable at the location of the broadcast receiver. Accordingly, it has been proposed, for example, as disclosed in detail in U.S. Pat. No. 3,845,394 issued Oct. 29, 1974, and having a common assignee herewith, to provide the described type of tuning apparatus with circuit arrangements by which the broadcast band may be searched to identify and memorize those stations from which the transmissions can be received and then to scan the receivable stations in succession or in a step-by-step manner. However, such circuit arrangements are quite complex and costly.

It has further been proposed, for example, in U.S. Pat. No. 3,163,823, issued Dec. 29, 1964, to provide the described type of tuning apparatus with a station selector that includes at least three switches respectively corresponding to the tens, units and tenths of the broadcast frequencies and which are individually actuated by the turning of respective thumb wheels through ten suitably labelled and detented positions for closing and opening respective sets of contacts by which the dividing ratio of the variable frequency divider is selected. It will be apparent that, with the foregoing station selector, scanning of the broadcast band to locate a desired station whose assigned frequency is not known requires the repeated successive actuation of the three thumb wheels, and this is again a bothersome and time consuming operation.

OBJECTS AND SUMMARY OF THE INVENTION

Accordingly, it is an object of this invention to provide a broadcast receiver with an improved tuning apparatus which is free of the above disadvantages of the prior art, and by which the receiver can be conveniently and accurately tuned to receive the radio waves transmitted by selected broadcasting stations.

Another object is to provide a tuning apparatus for a broadcast receiver by which accurate tuning thereof for the reception of a selected station can be relatively rapidly achieved without requiring any skill on the part of the operator.

Still another object is to provide a tuning apparatus, as aforesaid, of the type employing a digital frequency synthesizer for producing the local frequency signal, and having an improved station selector by which the necessary dividing ratio of the variable frequency divider is established to obtain the local frequency signal corresponding to the desired station or channel.

A further object is to provide a tuning apparatus, as aforesaid, in which a single tuning knob or control is manipulated to select the dividing ratio of the variable frequency divider and hence the local frequency of the tuning apparatus, and also to indicate on a suitably calibrated scale the broadcast frequency corresponding to the selected dividing ratio, whereby to facilitate the scanning of the broadcast band for locating a station or channel whose assigned frequency is not known.

In accordance with an aspect of this invention, a tuning apparatus having a digital frequency synthesizer with a phase locked loop, as described above, is provided with a dial member having a scale thereon calibrated to represent broadcast frequencies in a predetermined frequency band and cooperating with a pointer or indicator movable relative to the scale, as in response to turning of a tuning knob, for indicating the broadcast frequency to which the apparatus is tuned, a series of digitally coded indicia respectively corresponding to dividing ratios of the variable frequency divider which are suitable for tuning the apparatus to receive respective broadcasting stations and which are spaced apart in correspondence with the spacing of the respective broadcast frequencies of such stations along the scale, a pickup movable relative to the series of digitally coded indicia in synchronism with the relative movement of the indicator and scale for selectively reading the digitally coded indicia, and control circuit means for determining the dividing ratio of the variable frequency divider in accordance with the digitally coded indicia selectively read by the pickup.

In a preferred embodiment of the invention, the digitally coded indicia are constituted by respective patterns of holes formed in the dial member with the series of such indicia extending parallel to the scale, and the pickup is constituted by an optical reading member which is mechanically interconnected with the pointer or indicator and which is operative to detect the number and positioning of the holes constituting the digitally coded indicia being selectively read by the optical reading member.

The above, and other objects, features and advantages of the invention, will be apparent in the following detailed description of an illustrative embodiment of the invention which is to be read in connection with the accompanying drawing.

DESCRIPTION OF A PREFERRED EMBODIMENT

Figure 2:
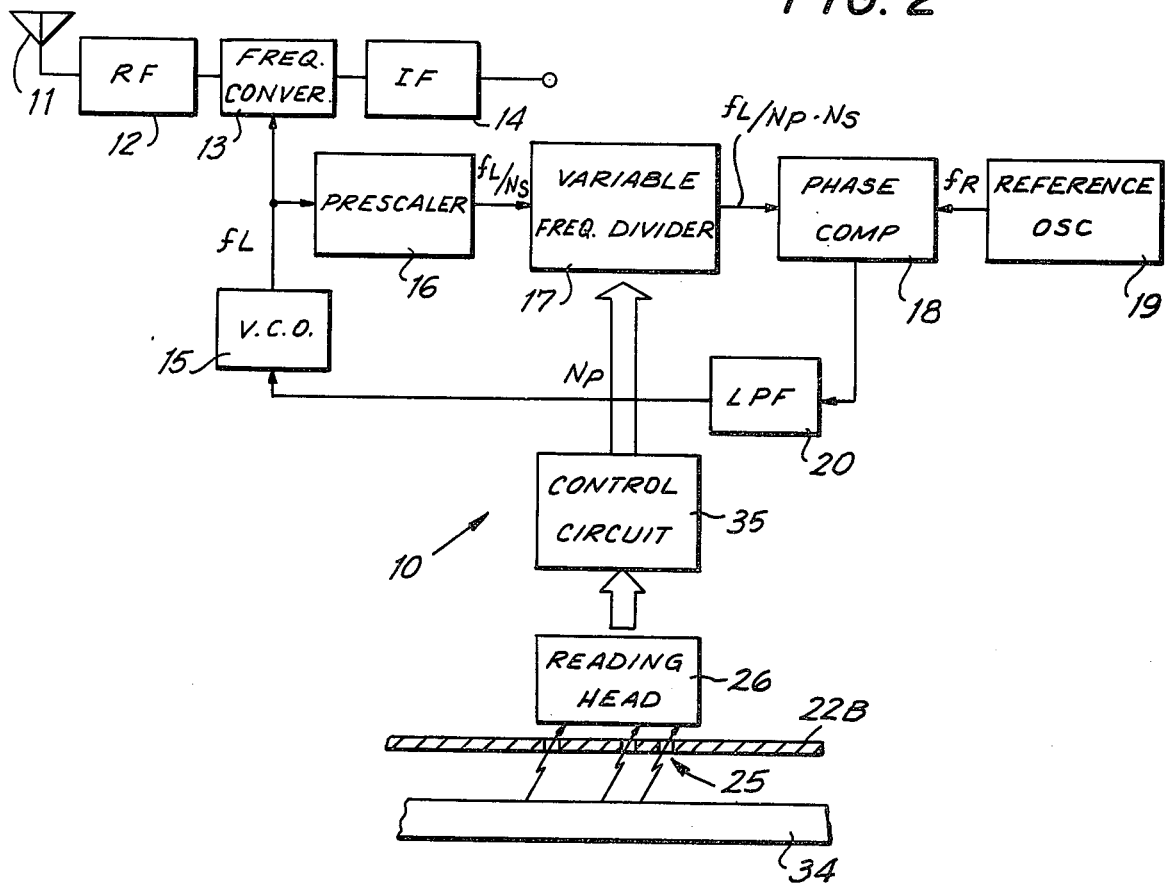
FIG. 2 is a block diagram of the tuning apparatus.

Referring to the drawing in detail, and initially to FIG. 2 thereof, it will be seen that a tuning apparatus 10 according to this invention is there shown associated with a broadcast receiver which has the usual antenna 11, a high or radio frequency amplifier 12 coupled to the antenna, a mixer or frequency converter 13 which receives the amplified radio frequency output of amplifier 12 and a local frequency signal $f_L$ which, when combined with the RF frequency transmitted by a selected station, will produce the standard IF frequency, for example, of 10.7 MHz, and an intermediate frequency amplifier 14 which receives the frequency converted or IF output of frequency converter 13. The output of the intermediate frequency amplifier 14 is transformed into an audio signal by means of the usual frequency discriminator and a low or audio frequency amplifier (not shown).

In the tuning apparatus according to this invention, the local frequency signal $f_L$ is produced by a digital frequency synthesizer which, as known, includes a voltage-controlled, variable frequency oscillator 15 having a phase-locked loop associated therewith. Such phase-locked loop is shown to include a prescaler or fixed frequency divider 16 in which the local frequency $f_L$ is divided by a fixed dividing ratio $N_S$ and then applied to a programmable or variable frequency divider 17 having a variable dividing ratio $N_P$. The output of variable frequency divider 17, at the frequency $f_L/N_P.N_S$, is applied to a frequency and phase comparator 18 which also receives a reference signal, at the fixed reference frequency $f_R$, from a reference frequency oscillator 19. The comparator 18 compares the frequency and phase of the output from divider 17 with the reference signal from oscillator 19 and, in response to deviations therebetween, provides a control voltage of signal which is fed back, preferably through a low pass filter 20, to the voltage controlled oscillator 15 for suitably varying the local frequency $f_L$ in the direction to achieve the phase-locked state, that is, the state in which there is frequency and phase correspondence between the outputs of variable frequency divider 17 and reference frequency oscillator 19. In such phase-locked state.

$$f_L = N_S \cdot N_P \cdot f_R \qquad (1)$$

It will be apparent from above equation (1) that the local frequency $f_L$ produced by voltage controlled oscillator 15 can be varied merely by suitably changing the value $N_P$ of the dividing ratio of variable frequency divider.

By way of example, in the case of a tuning apparatus 10 of a broadcast receiver intended for reception of the FM broadcast band in the United States, which band covers one hundred stations or channels having transmitting or carrier frequencies $f_{in}$ ranging from 88.1 MHz to 107.9 MHz in steps or increments of 200 KHz, with the local frequency $f_L$ being required to be the standard 10.7 MHz higher than the carrier frequency for which the apparatus is to be tuned, and with the fixed reference frequency $f_R$ being 25 KHz and the fixed dividing ratio $N_S$ of prescaler 16 having the value 2, then the dividing ratio $N_P$ of the variable frequency divider 17 for selectively tuning to the various stations will have the numerical values given in the table below:

TABLE I

| $F_{in}$(MHz) | $f_L$(MHz) | $N_P$ | Orderly Channel Number $N_C$ | Actual Channel Number $N_{CT}$ |
|---|---|---|---|---|
| 88.1 | 98.8 | 1976 | 1 | |
| 88.3 | 99.0 | 1980 | 2 | 4 |
| 88.5 | 99.2 | 1984 | 3 | 8 |
| 88.7 | 99.4 | 1988 | 4 | 12 |
| 88.9 | 99.6 | 1992 | 5 | 16 |
| 89.1 | 99.8 | 1996 | 6 | 20 |
| 89.3 | 100.0 | 2000 | 7 | 24 |
| 89.5 | 100.2 | 2004 | 8 | 28 |
| , | , | , | , | , |
| , | , | , | , | , |
| , | , | , | , | , |
| 107.7 | 118.4 | 2368 | 99 | 392 |
| 107.9 | 118.6 | 2372 | 100 | 396 |

Accordingly, it will be apparent that, in the example represented by the data on Table I, variation of the value of dividing ratio $N_P$ of the variable frequency divider in steps or increments of 4 from 1976 to 2372 will be effective to vary the local frequency $f_L$ from voltage-controlled oscillator 15 in steps or increments of 200 KHz from 98.8 MHz to 118.6 MHz, respectively. Thus, transmissions broadcast with the carrier frequencies of the FM broadcast band in the United States are selectively received by suitably selecting the value of the dividing ratio $N_P$ of variable frequency divider 17. If the reference frequency oscillator 19 is constituted by a quartz oscillator which accurately and reliably provides the reference frequency $F_R$, for example, of 25 KHz as above, then the local frequency $f_L$ at the output of voltage controlled oscillator 15 will be similarly accurately and reliably maintained for any selected value of the dividing ratio $N_P$. Further, upon a change in the dividing ratio $N_P$ of variable frequency divider 17, the respective new value of the local frequency $f_L$ is immediately obtained by the capturing effect of the described phase-locked loop.

When the intervals between the carrier or broadcasting frequencies of adjacent stations are 200 KHz, as in the United States FM broadcast band, it is theoretically possible to provide a between channel frequency $f_{CH}$ of 200 KHz. However, in the example represented by Table I, such between channel frequency $f_{CH}$ which is equal to $f_R \cdot N_S$, and which appears at the output of voltage controlled oscillator 15 when the dividing ratio $N_P$ of variable frequency divider 17 is undergoing change, is selected to be 50 KHz by the values of $f_R$=25 KHz and $N_S$=2 in such example. By reason of such value of $f_{CH}$=50KHz, and taking into account the characteristics, at tuning and detuning, of the usual frequency discriminator which receives the output of IF amplifier 14, a noise caused by DC switching during tuning operation is suppressed.

Figure 1:
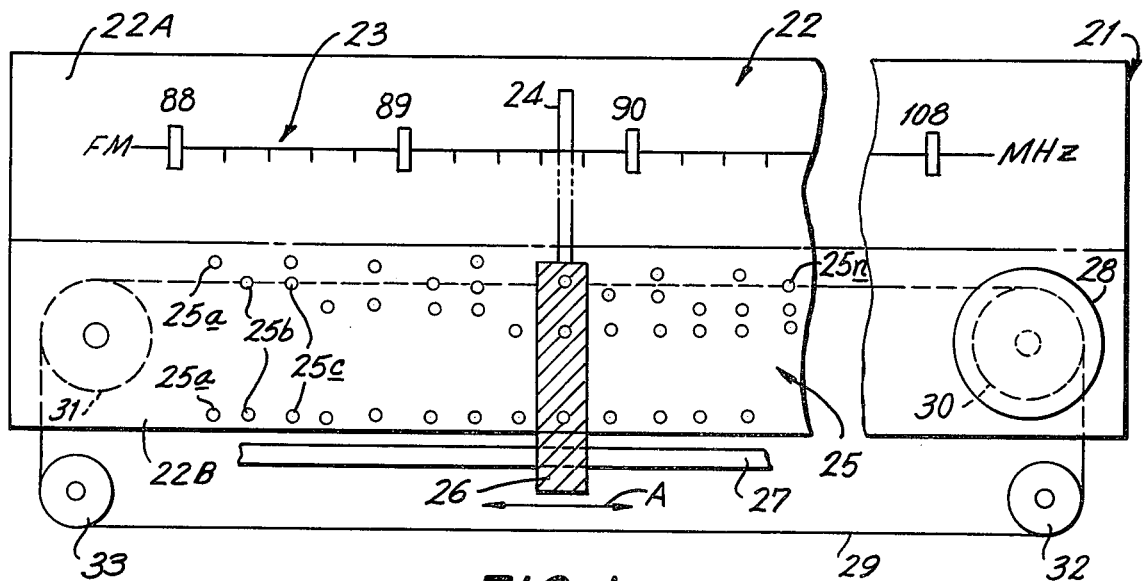
FIG. 1 is a schematic front elevational view of a control panel included in a tuning apparatus according to an embodiment of this invention.

Referring now to FIG. 1, it will be seen that the illustrated embodiment of a tuning apparatus according to this invention further has a control panel 21 which includes a dial member or plate 22 provided with a transparent portion 22A of a suitable plastic material, such as, methyl methacrylate. A scale 23 with calibrations representing broadcast frequencies over a predetermined frequency band, for example, over the FM broadcast band from 88 MHz to 108 MHz, as shown, is provided on transparent portion 22A of dial plate 22, and a pointer or indicator 24 is movable along scale 23, as hereinafter described, to cooperate with scale 23 in indicating the actual broadcast frequency to which the apparatus 10 is tuned. Further, the dial plate 22 is shown to have a portion 22B which may be opaque, and which is provided with a series 25 of digitally coded indicia 25a, 25b, 25c—25n. The indicia 25a–25n respectively correspond to the broadcasting stations which the receiver is intended to selectively receive, and such indicia 25a–25n are spaced apart in correspondence with the spacing between the broadcast frequencies of the respective stations along the scale 23.

In the case where the scale 23 for indicating broadcast frequencies is rectilinear, as shown, the series 25 of digitally coded indicia is desirably also arranged rectilinearly, that is, parallel to scale 23, with the indicia 25a–25n being aligned transversely, that is, in the direction at right angles to the length of scale 23, with the broadcasting frequencies on scale 23 of the corresponding stations. Thus, for example, the digitally coded indicia 25a corresponding to the FM station broadcasting with a carrier frequency of 88.1 MHz is aligned with that frequency on scale 23, while the digitally coded indicia 25b corresponding to the FM station broadcasting with a carrier frequency of 88.3 MHz is aligned with the latter frequency on scale 23.

A pickup or reading head 26 is mounted, for example, slidably supported on a guide rod 27, for movement relative to the series 25 of digitally coded indicia in the direction along such series, as indicated by the arrow A, for selectively reading the digitally coded indicia 25a–25n. Further, the pickup or reading head 26 and the pointer or indicator 24 are mechanically interconnected so that indicator 24 will indicate on scale 23 the carrier or broadcasting frequency of the station corresponding to the digitally coded indicia then being read by pickup or head 26. In the case where the series 25 of digitally coded indicia extends parallel to the scale 23 and the indicia 25a–25n are aligned with the carrier frequencies on scale 23 of the corresponding stations, as shown, the mechanical interconnection for achieving synchronous movement of head 26 and indicator 24 may be realized by merely securing indicator or pointer 24 on head 26.

The movement of head 26 along the series 25 of digitally coded indicia for selectively reading the latter may be effected in response to manual turning of a tuning knob 28, for example, by providing a cord 29 having its opposite ends anchored to head 26, and by running such cord 29 about a drive pulley 30 which is rotatable with knob 28 at one end of indicia series 25, an idler pulley 31 adjacent the opposite end of indicia series 25 and return pulleys 32 and 33 which are rotatably mounted below pulleys 30 and 31, respectively, as shown.

The digitally coded indicia 25a–25n may be read optically, magnetically, electrically or mechanically by pickup or head 26. For example, in the case where the digitally coded indicia are read optically, each of the digitally coded indicia 25a–25n may be constituted by a predetermined number of holes at predetermined positions in a respective area of the dial plate portion 22B, and a light or other radiant energy source 34 (FIG. 2) may be disposed at the side of the dial plate portion 22B opposite to head 26 which includes photosensitive elements (not shown) corresponding to all of the possible hole positions of the indicia. Thus, when head 26 is disposed to selectively read one of the digitally coded indicia 25a–25n, light or radiant energy will pass through the holes constituting the selected indicia for energizing the respective photosensitive elements of head 26 and thereby causing an associated control circuit 35 to produce a corresponding digitally coded signal which is applied to variable frequency divider 17 for establishing the dividing ratio $N_P$ of the latter required for tuning the receiver to the broadcasting station which corresponds to the digitally coded indicia then being read by head 26.

The variable frequency divider 17 and the control circuit 35 for establishing its dividing ratio in response to the digitally coded indicia selectively read by pickup or head 26 may be formed of conventional digital logic components. For example, as in existing digital frequency synthesizers, the variable frequency divider 17 may be in the form of a binary down counter which is counted down by clock pulses constituted by the divided local frequency signal $f_L/N_S$ from prescaler 16. Such binary down counter is loaded or preset with the value of a selected dividing ratio by means of suitable digital signals from control circuit 35 determined by the digitally coded indicia read by pickup or head 26. The loading or presetting of the binary down counter occurs each time the latter counts down to a predetermined value, for example, to the value of "0", at which time, a pulse is provided at the output from the variable frequency divider 17. After such loading or presetting of the counter, each clock pulse from prescaler 16 merely causes the counter to count down by one until the counter has again counted down to the value of "0" to emit a pulse and to be again preset with the value of the selected dividing ratio. Thus, the output pulses supplied from divider 17 to comparator 18 will have a frequency of $f_L/N_S \cdot N_P$, as desired.

In the tuning apparatus according to this invention, the digitally coded indicia 25a–25n may simply be binary coded representations of the respective values of the dividing ratio $N_P$. Thus, in the case of the example given on Table I, the indicia 25a–25n will constitute the binary codes for the values 1976–2372, respectively, in steps or increments of 4. The binary coded values of 1976–2372 will require 12 bits of data, that is, there will have to be 12 possible locations of holes for each of the indicia 25a–25n and, similarly, 12 correspondingly located photosensitive elements in the head 26 for detecting or reading the presence of such holes. Thus, if the indicia 25a–25n represent the binary codes for actual values of the desired dividing ratios $N_P$, that is, the values 1976–2372, the head 26 may be undesirably complicated, and the area of the dial plate portion 22B for accommodating the series 25 of digitally coded indicia may be undesirably large.

However, as shown on Table I, the values $N_P$ of the dividing ratio required for the one hundred channels of the FM broadcast band which are identified by the "Orderly Channel Number $N_C$" of 1 to 100, respectively, may be written as:

$$N_P = N_{CT} + 1976 \qquad (2)$$

in which $N_{CT}$ has a value varying from 0 to 396 in increments or steps of 4. It will be apparent that the values of $N_{CT}$ varying from 0 to 396 can be represented by binary codes requiring only 9 bits of data. Therefore, it is desirable that the digitally coded indicia 25a–25n represent the binary codes for $N_{CT}$, that is, the values from 0 to 396, respectively, so that the area of the dial plate portion 22B required for the indicia and the complexity of the head 26 for reading the indicia may be reduced. In the case where the indicia 25a–25n represent the binary codes of the values of $N_{CT}$, rather than of the values of the dividing ratio $N_P$ itself, the control circuit 35 may include an adder which is effective to add the value 1976 to the coded value of $N_{CT}$ read by the head 26 and to apply the resulting total, or the respective value of $N_P$ to the variable frequency divider 17 for presetting or loading the down counter of the latter, as previously described.

When the ordinary binary code is employed for the indicia 25a–25n, there is the possibility that erroneous operations may be caused when reading the coded indicia by reason of the reversal of the states of numerous bits of the data that occur between successive binary coded numbers. For example, as shown in the below Table II which gives the binary codes for the counter numbers from "0" to "15", all four bits of the data in the counter are changed when the binary coded number "8" is read after reading of the binary coded number "7".

TABLE II

| Counter No. | Binary Code | Binary Gray Code |
|---|---|---|
| 0 | 0000 | 0000 |
| 1 | 0001 | 0001 |
| 2 | 0010 | 0011 |
| 3 | 0011 | 0010 |
| 4 | 0100 | 0110 |
| 5 | 0101 | 0111 |
| 6 | 0110 | 0101 |
| 7 | 0111 | 0100 |
| 8 | 1000 | 1100 |
| 9 | 1001 | 1101 |
| 10 | 1010 | 1111 |
| 11 | 1011 | 1110 |
| 12 | 1100 | 1010 |
| 13 | 1101 | 1011 |
| 14 | 1110 | 1001 |
| 15 | 1111 | 1000 |
| , | , | , |
| , | , | , |
| , | , | , |

However, if the binary gray code is employed for representing the values of $N_{CT}$ by the indicia 25a–25n, the possibility of such errors occurring is avoided as only one bit of the data has its state changed in reading successive counter numbers, as is also shown in Table II. Thus, the indicia 25a–25n preferably represent binary gray coded values of $N_{CT}$. In that case, the control circuit 35 through which the binary down counter of variable frequency divider 17 is loaded or preset with a selected value of the dividing ratio $N_P$ in response to the reading by head 26 of a respective one of the indicia 25a–25n preferably includes a well-known code converter (not shown).

If the value of $N_P$ preset or loaded in the binary down counter of variable frequency divider 17 is expressed by equation (2) above, that is, $N_P = N_{CT} + 1976$, with $N_{CT}$ varying from 0 to 396 in steps or increments of 4 as detected by head 26 when selectively reading the coded indicia 25a–25n, then the several bits of the adder through which the down counter is preset will be in the state "11110111000" when head 26 reads indicia 25a representing the value $N_{CT}=0$, that is, $N_P=1976$ for tuning the receiver to the station having a carrier frequency $f_{in}$ of 88.1 MHz. In the foregoing case, the counter of divider 17 is counted down to the value "0" by the clock pulses from prescaler 16 after each presetting or loading of the counter with the value $N_P = N_{CT} + 1976$, so that the frequency of the pulses at the output of divider 17 is $f_L/N_S \cdot N_P$, as previously described.

Alternatively, the down counter of variable frequency divider 17 may be loaded or preset with a value $N_P'$ determined by the below equation.

$$N_P' = N_{CT} + 1976 + K \qquad (3)$$

in which K is a suitable constant. In the case where the down counter of divider 17 is loaded or preset with such value $N_P'$, the counting down by the signal $f_L/N_S$ from prescaler 16 continues until the content of the counter has reached the value K, at which time the counter is again preset to the value $N_P'$ and a pulse issues from divider 17 to comparator 18. Thus, even when the counter of divider 17 is loaded or preset with the value $N_P' = N_{CT} + 1976 + K$, the output supplied from divider 17 to comparator 18 still has the frequency $f_L/N_S \cdot N_P$ in which $N_P = N_{CT} + 1976$, as previously described.

However, when the counter of divider 17 is loaded or preset with the value $N_P' = N_{CT} + 1976 + K$ and the constant K is assumed to have the value 72, that is, the loaded or preset value $N_P' = N_{CT} + 2048$, it will be seen that the loaded or preset value for the condition $N_{CT} = 0$ becomes the value 2048 which is $2^{11}$. When the value 2048 or $2^{11}$ is set in the binary down counter of divider 17, the bits of the down counter will be in the state "10000000000", that is, the 0 to 10 bits will be in the "0" state, so that the adder for obtaining $N_{CT} + 2048$ can be of relatively simple construction.

Although a tuning apparatus according to this invention has been specifically described for use with the FM broadcast band in the United States, that is, the band having 100 stations or channels with assigned frequencies ranging from 88.1 MHz to 107.9 MHz in steps or increments of 200 KHz, a tuning apparatus embodying the invention may be similarly provided for use with other broadcast bands, for example, the band having stations with assigned frequencies ranging from 76.1 to 88.9 MHz in steps or increments of 100 KHz.

Further, in the illustrated embodiment, the pickup or reading head 26 and the indicator 24 are movable relative to the fixed dial plate 22 having the series 25 of digitally coded indicia and scale 23 thereon. However, if desired, the indicator 24 and head 26 may be fixed, while the scale 23 and series 25 of indicia 25a–25n are movable relative thereto, for example, by being formed on a belt-like member of relatively thick Mylar sheet material or the like which is moved past the fixed head and pointer or indicator in response to turning of the tuning knob.

It will be apparent that, in the tuning apparatus according to this invention, scanning of the broadcast band shown on scale 23 to locate a station of which the assigned frequency is not known is simply and rapidly achieved by turning the single tuning knob 28, for example, as in the prior art tuners which employ a variable condenser to establish the local frequency. However, in the tuning apparatus according to this invention, such simple tuning operation is achieved with a digital frequency synthesizer instead of the variable condenser, whereby to obtain the advantageous reliably accurate tuning characteristic of such frequency synthesizer. It will further be seen that, in the tuning apparatus according to this invention, the scale 23 for indicating the broadcast frequencies to which the receiver is tuned may be rectilinear and have uniformly spaced graduations therealong, so that the accurate production of such scale is facilitated.

Having described a specific embodiment of the invention with reference to the accompanying drawing, it is to be understood that the invention is not limited to that precise embodiment, and that various changes and modifications may be effected therein by one skilled in the art without departing from the scope or spirit of the invention as defined in the appended claims.

What is claimed is:

1. In a tuning apparatus for a broadcast receiver having a voltage controlled variable frequency oscillator for generating a local frequency signal corresponding to a selected broadcasting station, and being provided with a phase locked loop including a reference signal oscillator, a variable frequency divider for dividing said local frequency signal with a variable dividing ratio, and comparator means for comparing the frequency and phase of outputs of said reference signal oscillator and said variable frequency divider, respectively, and producing a corresponding control voltage which is applied to said voltage controlled oscillator for determining said local frequency signal in dependence on said dividing ratio of the variable frequency divider; the combination of a dial member having a scale thereon with calibrations representing broadcast frequencies over a predetermined frequency band, an indicator movable relative to said scale to cooperate with the latter for indicating the broadcast frequency to which the tuning apparatus is tuned, an array of spaced apart digitally coded indicia each corresponding to a predetermined one of said broadcasting stations which are adapted to be selectively received by the broadcast receiver, each of said digitally coded indicia being spaced apart in correspondence with the spacing of the broadcast frequencies of the respective stations along said scale, a pickup head movable relative to said array of digitally coded indicia to scan said indicia in synchronism with the relative movement of said indicator and scale for selectively reading said digitally coded indicia, and control means for determining said dividing ratio of said variable frequency divider in accordance with the digitally coded indicia selectively read by said pickup head.

2. A tuning apparatus for a broadcast receiver according to claim 1; in which said indicia comprise binary codes.

3. A tuning apparatus for a broadcast receiver according to claim 1; in which said indicia comprise binary gray codes.

4. A tuning apparatus for a broadcast receiver according to claim 1; in which said array of digitally coded indicia are also provided on said dial member.

5. A tuning apparatus for a broadcast receiver according to claim 4; in which said array of digitally coded indicia is disposed adjacent to and extends parallel with said scale.

6. A tuning apparatus for a broadcast receiver according to claim 5; in which said pickup head and said indicator are mechanically interconnected as a unit for simultaneous movement along said array of digitally coded indicia and said scale, respectively.

7. A tuning apparatus for a broadcast receiver according to claim 1; in which each of said digitally coded indicia represents a respective value of said dividing ratio of the variable frequency divider.

8. A tuning apparatus for a broadcast receiver according to claim 1; in which each of said digitally coded indicia represents a respective value which, when added to a constant value, provides a determining value of said dividing ratio of the variable frequency divider.

9. In a tuning apparatus for a broadcast receiver having a voltage controlled variable frequency oscillator for generating a local frequency signal corresponding to a selected broadcasting station, and being provided with a phase locked loop including a reference signal oscillator, a variable frequency divider for dividing said local frequency with a variable dividing ratio, and comparator means for comparing the frequency and phase of outputs of said reference signal oscillator and said variable frequency divider, respectively, and producing a corresponding control voltage which is applied to said voltage controlled oscillator for determining said local frequency signal in dependence on said dividing ratio of the variable frequency divider; the combination of a dial member having a scale thereon with calibrations representing broadcast frequencies over a predetermined frequency band, an indicator movable relative to said scale to cooperate with the latter for indicating the broadcast frequency to which the tuning apparatus is tuned, means defining a series of digitally coded indicia respectively corresponding to a plurality of broadcasting stations which are adapted to be selectively received by the broadcast receiver, said digitally coded indicia being constituted by respectively positioned holes in said dial member, and being spaced apart in correspondence with the spacing of the broadcast frequencies of the respective stations along said scale, pickup means movable relative to said series of digitally coded indicia in synchronism with the relative movement of said indicator and scale for selectively reading said digitally coded indicia, said pickup means including an optical reading member for detecting the number and positioning of the holes constituting the digitally coded indicia being selectively read thereby, and control means for determining said dividing ratio of said variable frequency divider in accordance with the digitally coded indicia selectively read by said pickup means.

* * * * *